(12) United States Patent  (10) Patent No.: US 7,511,580 B2
Hung  (45) Date of Patent: Mar. 31, 2009

(54) CHARGE PUMP CIRCUIT WITH DYNAMIC CURRENT BIASING FOR PHASE LOCKED LOOP

(75) Inventor: Kenneth Wai Ming Hung, Pak Shek Kok (HK)

(73) Assignee: Smartech Worldwide Limited, Hong Kong (CN)

( * ) Notice: Subject to any disclaimer, the term of this patent is extended or adjusted under 35 U.S.C. 154(b) by 136 days.

(21) Appl. No.: 11/690,835

(22) Filed: Mar. 25, 2007

(65) Prior Publication Data

US 2008/0231346 A1  Sep. 25, 2008

(51) Int. Cl.
*H03L 7/08* (2006.01)
(52) U.S. Cl. ......................................... 331/16; 327/157
(58) Field of Classification Search ................... 331/16, 331/15, 17, 176; 327/157, 156, 148, 536
See application file for complete search history.

(56) References Cited

U.S. PATENT DOCUMENTS

| | | | |
|---|---|---|---|
| 6,118,346 A | 9/2000 | Olgaard | |
| 6,124,741 A | 9/2000 | Arcus | |
| 6,781,425 B2 | 8/2004 | Si | |
| 6,897,690 B2 | 5/2005 | Keaveney | |
| 6,906,565 B2 | 6/2005 | Keaveney | |
| 6,919,769 B2 | 7/2005 | Lim | |
| 6,937,075 B2 | 8/2005 | Lim | |
| 6,980,046 B2 | 12/2005 | Soe | |
| 6,989,698 B2 | 1/2006 | Jeong | |
| 7,009,432 B2 | 3/2006 | Beghein | |
| 7,012,473 B1 | 3/2006 | Kokolakis | |
| 7,034,588 B2 | 4/2006 | Cheung | |
| 7,148,757 B2 | 12/2006 | Chiu | |
| 7,224,233 B2* | 5/2007 | Park | 331/16 |
| 7,271,645 B2* | 9/2007 | Park | 327/536 |
| 2005/0162200 A1* | 7/2005 | Haerle | 327/157 |

* cited by examiner

*Primary Examiner*—Robert Pascal
*Assistant Examiner*—Ryan J. Johnson
(74) *Attorney, Agent, or Firm*—Xin Wen

(57) ABSTRACT

A charge pump circuit includes a first PMOS transistor, a first NMOS transistor connected with the first PMOS transistor at a CPOUT node that is configured to provide an output signal from the charge pump circuit, and a second PMOS transistor connected between a high-voltage supply terminal (VDD) and the first PMOS transistor. The second PMOS transistor can provide a current IUP to the first PMOS transistor. A capacitor is connected to VDD and the gate of the second PMOS transistor. The charge pump circuit also includes an operational amplifier having its negative input and its output connected to the gate of the second PMOS transistor, and its positive input connected to the CPOUT node.

18 Claims, 9 Drawing Sheets

CHARGE PUMP CIRCUIT WITH DYNAMIC CURRENT BIASING FOR PHASE LOCKED LOOP

BACKGROUND

The present disclosure relates to an electronic circuit, more particularly relates to a charge pump circuit with dynamic current biasing for a fast locked phase locked loop circuit.

Phase locked loop (PLL) circuit plays important role in generating clock signals and other synchronized timing signals in electronic systems. PLL circuits are widely used in areas ranging from PC motherboard clock generator to wireless transceiver frequency synthesizer. Almost all applications require the PLL to be turned on and locked fast. For example, in a typical microcontroller with PLL integrated inside, the faster the PLL to lock, the faster the microcontroller can respond to system. People can always easily switch from one clock source to PLL clock without waiting a long time due to long locked time for the PLL. Thus, a PLL with a faster lock-in rate can give an end-product better performance and much more user-friendly. Lock-in time, $T_L$, is thus a critical parameter for a PLL circuit. $T_L$ is defined as the time required for a PLL to lock from the un-locked state.

As such, circuit designers always sought to reduce the lock-in time in PLL circuits. As described in "Phase-Locked Loops: Design, Simulation, and Applications" by Roland E. Best, published by McGraw-Hill Professional; 5th edition, 2003, the lock-in time $T_L$ can be defined using the following equation:

$$T_L = (2 \times \pi)/\omega_N \quad (1)$$

where $\omega_N$, the natural frequency of the PLL circuit, can be expressed by the following equation:

$$\omega_N = \mathrm{sqrt}\,((K_{CP} \times K_{VCO})/(N \times C_2)) \quad (2)$$

where $K_{CP}$ is charge-pump gain that equals to the charge pump current; $K_{VCO}$ is voltage-controlled-oscillator (VCO) gain that is defined as the slope of the VCO frequency against VCO voltage. $K_{CP}$ has a unit of μA. $K_{VCO}$ has a unit of MHz/V. N is a feedback divider coefficient, which is usually an integer number. $C_2$ is the capacitance of a capacitor $C_2$ in the loop filter (FIG. 2).

Substituting (1) into (2), we obtain:

$$T_L = (2 \times \pi)/\mathrm{sqrt}\,((K_{CP} \times K_{VCO})/N \times C_2)) \quad (3)$$

The equation (3) shows that $T_L$ can be reduced by an increase either $K_{CP}$ or $K_{VCO}$ or a decrease N or $C_2$.

Furthermore, a phase jitter noise bandwidth $B_L$ can be defined as $$B_L = (\omega_N/2) \times (\zeta + 1/4\zeta) \quad (4)$$

where $\zeta$ is the damping factor of the PLL. Equations (1) and (4) show that the lock-in time and the phase jitter noise bandwidth follow opposite trends as a function of $\omega_N$. As $\omega_N$ increases, the lock-in time decreases, but the phase jitter noise bandwidth increase, that is, more jitter are introduced into the electronic system. There is therefore a need for reducing the lock-in times in PLL circuits while minimizing the jitter noise in the system.

SUMMARY

In a general aspect, the present invention relates to a charge pump circuit including:

a first PMOS transistor;
a first NMOS transistor connected with the first PMOS transistor at a CPOUT node that is configured to provide an output signal from the charge pump circuit;
a second PMOS transistor connected between a high-voltage supply terminal (VDD) and the first PMOS transistor, the second PMOS transistor being configured to provide a current IUP to the first PMOS transistor;
a second NMOS transistor connected between a low-voltage supply terminal (VSS) and the first NMOS transistor, the second NMOS transistor being configured to receive a current IDN to the second NMOS transistor;
a capacitor connected to VDD and the gate of the second PMOS transistor; and
an operational amplifier (OP-AMP) having its negative input and its output connected to the gate of the second PMOS transistor, and its positive input connected to the CPOUT node.

In another general aspect, the present invention relates to a charge pump circuit, including:

a first PMOS transistor controlled by an input signal UPB;
a first NMOS transistor connected with the first PMOS transistor at a CPOUT node that is configured to provide an output signal from the charge pump circuit, wherein the first NMOS transistor is controlled by an input signal DN;
a second PMOS transistor connected between a high-voltage supply terminal (VDD) and the first PMOS transistor, the second PMOS transistor being configured to provide a current IUP to the first PMOS transistor,
a second NMOS transistor connected between a low-voltage supply terminal (VSS) and the first NMOS transistor, the second NMOS transistor being configured to receive a current IDN from the second NMOS transistor;
a capacitor connected to VDD and the gate of the second PMOS transistor;
an operational amplifier (OP-AMP) having its negative input and its output connected to the gate of the second PMOS transistor, and its positive input connected to the CPOUT node;
a third PMOS transistor configured as a current mirror transistor for the second PMOS transistor; and
a third NMOS transistor configured as a current mirror transistor for the second NMOS transistor, wherein the third PMOS transistor and the third NMOS transistor are connected between VDD and VSS.

In yet another general aspect, the present invention relates to a charge pump circuit, including:

a first PMOS transistor controlled by an input signal UPB;
a first NMOS transistor connected with the first PMOS transistor at a CPOUT node that is configured to provide an output signal from the charge pump circuit, wherein the first NMOS transistor is controlled by an input signal DN;
a second PMOS transistor connected between a high-voltage supply terminal (VDD) and the first PMOS transistor, the second PMOS transistor being configured to provide a current IUP to the first PMOS transistor;
a second NMOS transistor connected between a low-voltage supply terminal (VSS) and the first NMOS transistor, the second NMOS transistor being configured to receive a current IDN from the second NMOS transistor;
a capacitor connected to VDD and the gate of the second PMOS transistor;

an operational amplifier (OP-AMP) having its negative input and its output connected to the gate of the second PMOS transistor, and its positive input connected to the CPOUT node;

a third PMOS transistor configured as a current mirror transistor for the second PMOS transistor;

a third NMOS transistor configured as a current mirror transistor for the second NMOS transistor, wherein the third PMOS transistor and the third NMOS transistor are connected between VDD and VSS;

a fourth PMOS transistor connected between the second PMOS transistor and the first PMOS transistor, wherein the second PMOS transistor and the fourth PMOS transistor are connected in a cascoded configuration to provide the current IUP to the first PMOS transistor, and wherein the fourth PMOS transistor is configured to be controlled by a bias voltage signal (BIASP); and a fifth PMOS transistor configured to control the mirror current IDY in response to BIASP received at the gate of the fourth PMOS transistor.

Implementations of the system may include one or more of the following. The charge pump circuit can further include a third PMOS transistor configured as a current mirror transistor for the second PMOS transistor, and a third NMOS transistor configured as a current mirror transistor for the second NMOS transistor, wherein the third PMOS transistor and the third NMOS transistor are connected between VDD and VSS. The third PMOS transistor and the third NMOS transistor can allow a mirror currently IDY flowing between VDD and VSS, wherein the mirror currently IDY is substantially the same as the current IUP or the current IDN. The charge pump circuit can further include a fourth PMOS transistor; and a fourth NMOS transistor connected to the fourth PMOS transistor, wherein the fourth PMOS transistor and the fourth NMOS transistor are configured to control the mirror current IDY in response to a bias voltage signal (BIASP) received at the gate of the fourth PMOS transistor and a bias voltage signal (BIASN) received at the gate of the fourth NMOS transistor. The charge pump circuit can further include a third PMOS transistor connected between the second PMOS transistor and the first PMOS transistor, wherein the second PMOS transistor and the third PMOS transistor are connected in a cascoded configuration to provide the current IUP to the first PMOS transistor, and wherein the third PMOS transistor is configured to be controlled by a bias voltage signal (BIASP). The charge pump circuit can further include a third NMOS transistor connected between the second NMOS transistor and the first NMOS transistor, wherein the second NMOS transistor and the third NMOS transistor are connected in a cascoded configuration to receive the current IDN from the first NMOS transistor, and wherein the third NMOS transistor is configured to be controlled by a bias voltage signal (BIASN). The charge pump circuit can further include a third PMOS transistor; and a third NMOS transistor connected with the third PMOS transistor, wherein the third PMOS transistor and the third NMOS transistor are configured to receive the current IUP and send a current IDN substantially equal to the current IUP to the second NMOS transistor when at least one of the first PMOS transistor or the first NMOS transistor is turned off. The first PMOS transistor and the third PMOS transistor can be respectively controlled by an input signal UPB and an input signal UP, wherein UP and UPB are complementary signals. The first NMOS transistor and the third NMOS transistor can be respectively controlled by an input signal DN and an input signal DNB, wherein DN and DNB are complementary signals. The charge pump circuit can further include a third NMOS transistor connected to the node CPOUT and VSS, the third NMOS transistor configured to be controlled by an external signal ENB; and a fourth NMOS transistor connected between the first NMOS transistor and VSS, the fourth NMOS transistor configured to be controlled by an external signal EN, wherein EN and ENB are complementary signals.

Embodiments may include one or more of the following advantages. The disclosed charge pump circuit can dynamically provide charge-pump gain or charge pump current depending on the operation mode of the circuit. This dynamic capability allows the disclosed charge pump circuit to be able to simultaneously optimize several properties of the host circuit that it provides the charge current to. The dynamic capability also allows the disclosed charge pump circuit to be flexibly applied to a wide range of circuit applications.

The disclosed phase locked loop circuit can provide faster frequency locking and lower jitter noise. The disclosed phase locked loop circuit can have shorter lock-in times than conventional PLL circuits. At the same, the disclosed phase locked loop circuit can also minimize jitter noise. The decreased lock-in time and minimized jitter noise are achieved by dynamically adjusting charge pump current, which determines the natural frequency $\omega_N$ in the disclosed PLL circuit. $\omega_N$ and the charge pump current are increased to reduce the lock-in time during frequency locking. After the electronic system is locked into a new frequency, $\omega_N$ and the charge pump current are decreased to minimize the jitter noise bandwidth. The increased locking rate and decreased noise make the disclosed phase locked loop circuit suitable for a wide range of electronic applications.

Another advantage of the disclosed charge pump circuit is that the charge and discharge current are kept substantially constant through the locking process and after the lock-in. Thus, the loop filter voltage can be kept constant to prevent the output frequency from varying.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles of the invention.

DETAILED DESCRIPTION

Figure 1:
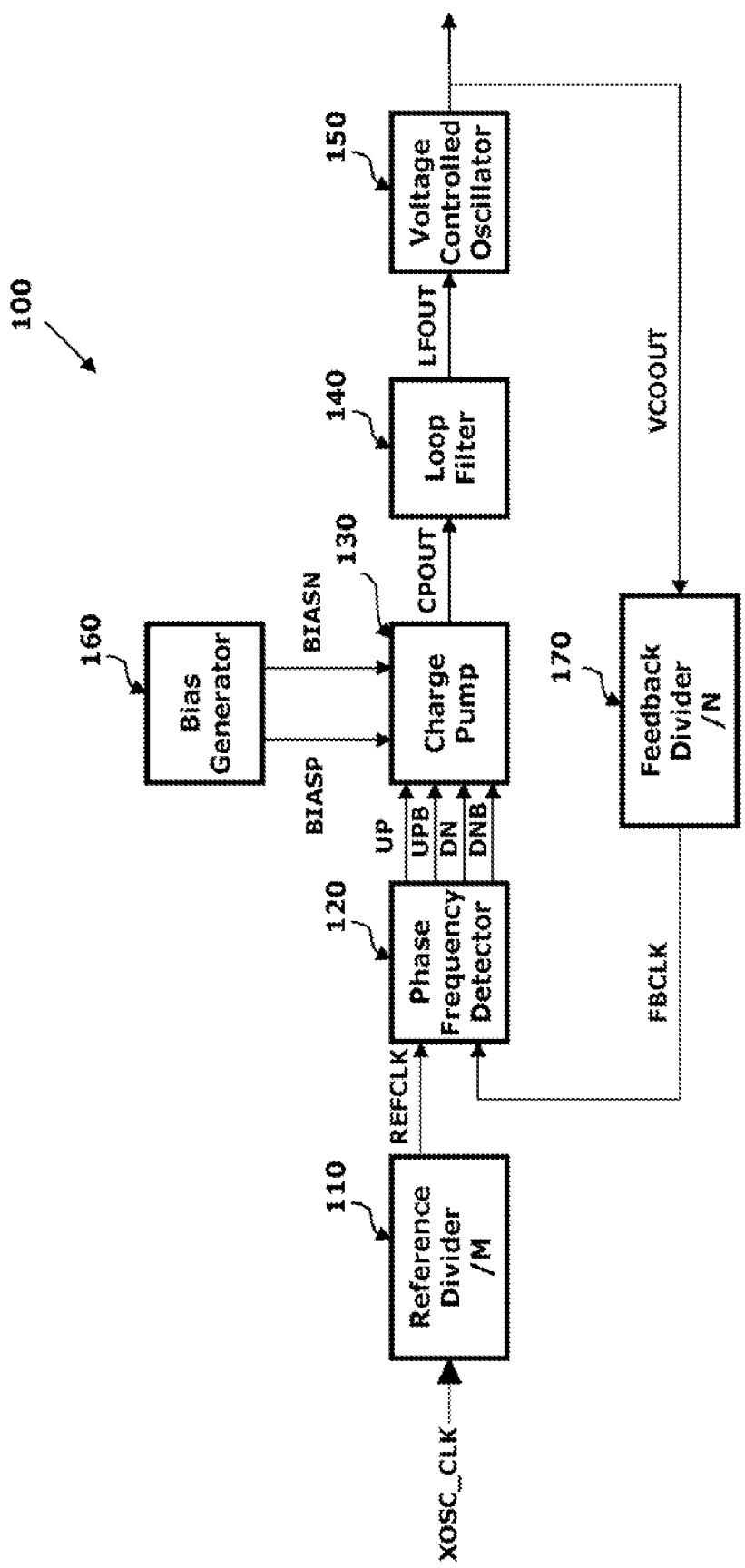
FIG. 1 is a block diagram for a phase locked loop circuit.

A phase locked loop circuit 100, as shown in FIG. 1, can include a reference divider 110, a phase frequency detector (PFD) 120, a charge pump (CP) 130, a loop filter (LF) 140, a voltage controlled oscillator (VCO) 150, a bias generator (BG) 160, and a feedback divider (FD) 170.

The reference divider 110 can divide an incoming clock signal, often received from a crystal oscillator, to produce a divided reference clock signal REFCLK by a factor of M. For example, if the XOSC_CLK is 4 MHz and M=4, then REFCLK is 1 MH. The phase frequency detector 120 can detect the phase and frequency difference between the signal REFCLK and a signal FBCLK from the feedback divider 170 and the VCO 150. The charge pump 130 can charge or discharge the loop filter 140 in response to four input signals UP, UPB, DN, and DNB from the PFD 120 and to produce an output signal CPOUT. The loop filter 140 can receive the signal CPOUT and transform the charges from the charge pump 130 to a voltage signal LFOUT. The loop filter 140 can act as a low pass filter to minimize spurs from the previous stages. The voltage controlled oscillator 150 can oscillate to output an oscillating signal VCOOUT in response to the input voltage signal LFOUT. The frequency of the VCOOUT signal can increase or decrease as a function of LFOUT, that is, the VCO gain can be negative or positive depending on the actual VCO design. VCOOUT is also the PLL output frequency to be used in system for other functional blocks. The bias generator 160 can output voltage signals BIASP and BIASN that can produce a fixed voltage to the charge pump 130 that can in turn charge or discharge the loop filter 140. The feedback divider 170 can divide the frequency of the VCO output VCOOUT by a factor of N to a frequency that matches with the frequency of REFCLK. Once the frequency and phases of the output FBCLK signal from the FD 170 match those of the signal REFCLK, the PLL circuit 100 is said to be locked. The time it takes to establish the locked status from an un-locked status is the lock-in time $T_L$.

Figure 2:
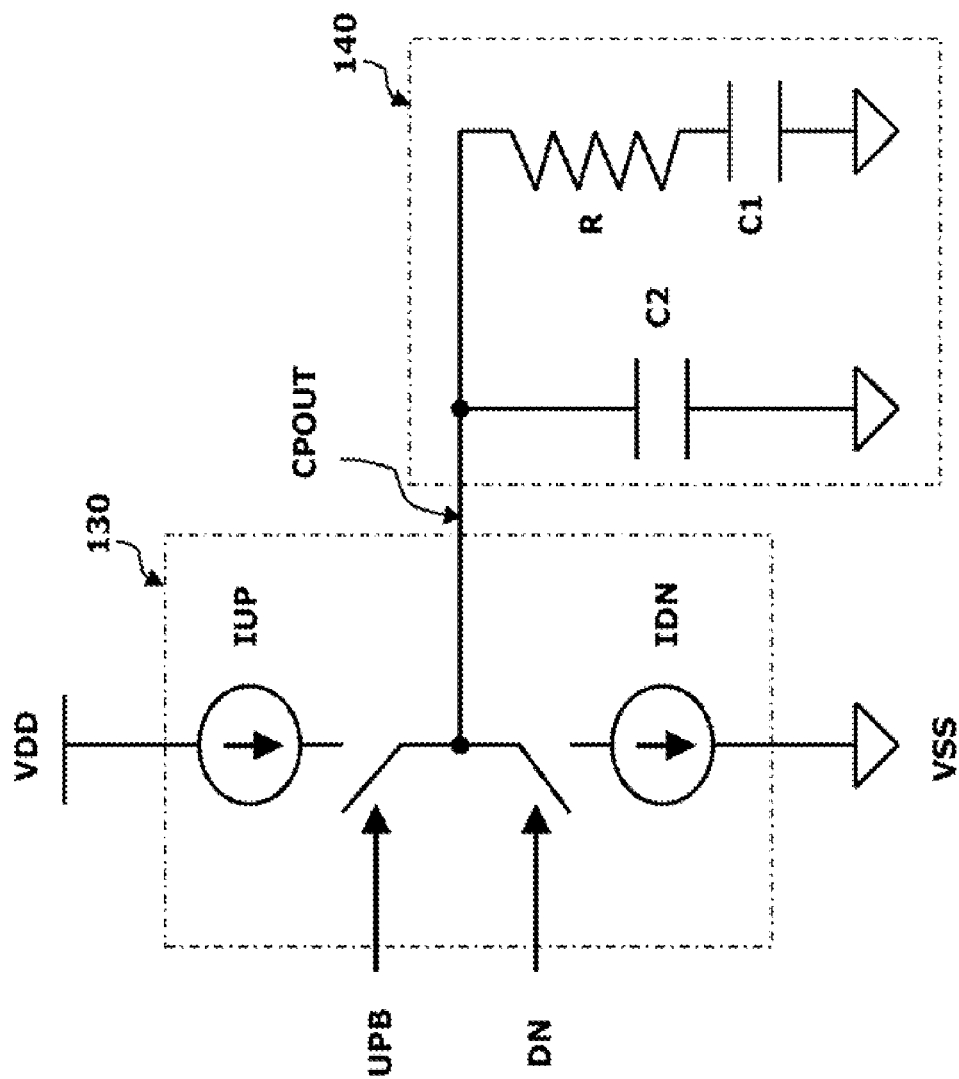
FIG. 2 is a schematic diagram for a model for a charge pump circuit.

A detailed schematic diagram for the charge pump 130 connected and the loop filter 140 is shown in FIG. 2. When UPB is at logic low, IUP flows from VDD to the node CPOUT to charge up the loop filter. When DN is at logic high, IDN flows from node CPOUT to VSS to discharge the loop filter. Therefore, the CP 130 can convert a current signal to a voltage signal by the charges accumulated in the loop filter 140.

Figure 3:
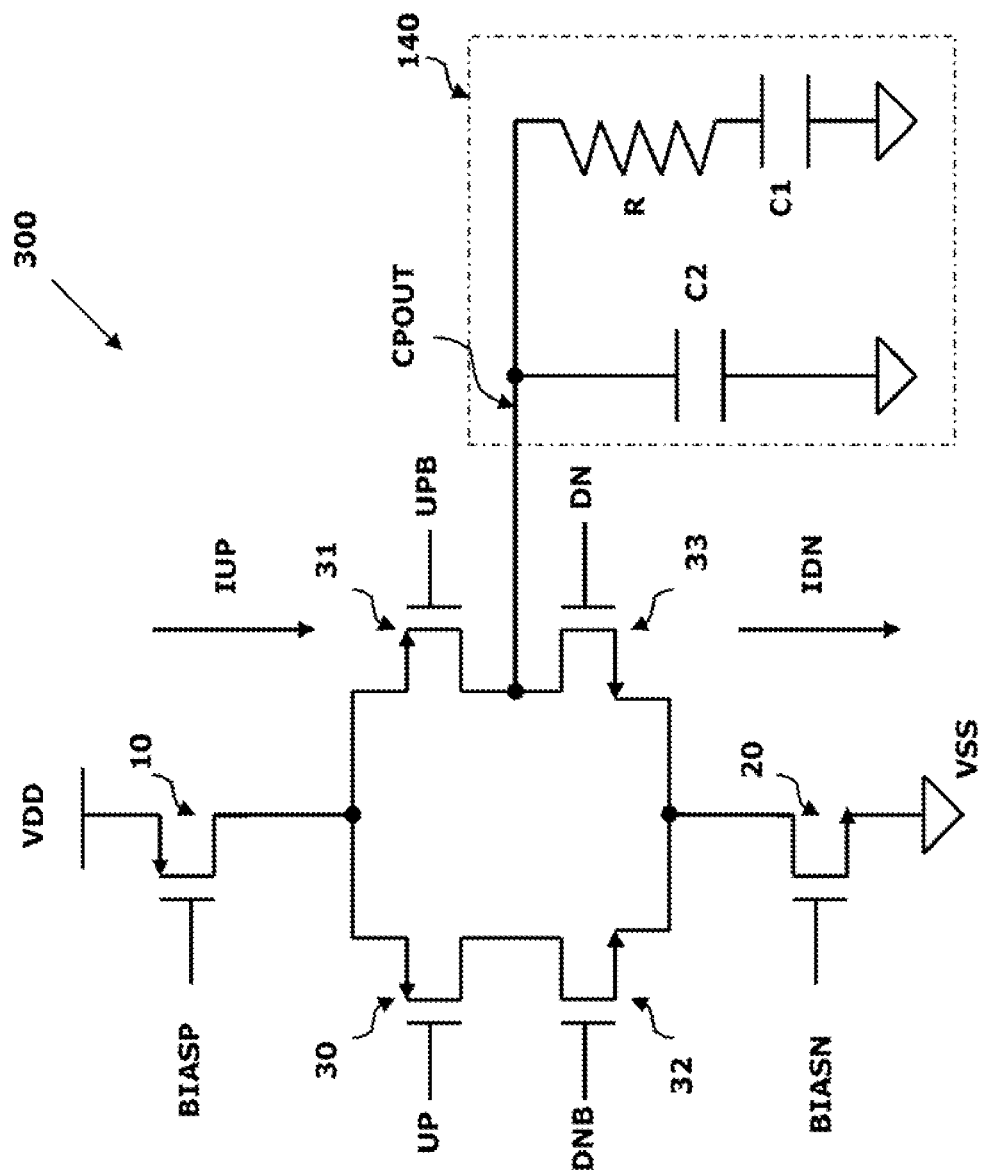
FIG. 3 is a schematic diagram for an implementation of a conventional charge pump circuit.

FIG. 3 shows a conventional implementation of the charge pump 130 includes a PMOS transistor 10 and an NMOS transistor 20. The signals IUP and IDN are formed from PMOS transistor 10 and NMOS transistor 20 biased with BIASP and BIASN signals from bias generator. The charge pump 130 can include four switches formed from two PMOS transistors 30 and 31 and two NMOS transistors 32 and 33. UPB is the inverted logic of UP and DNB is the inverted logic of DN. When UPB is at logic low, UP is at logic high, charging up the loop filter. When DN is at logic high, DNB is at logic low, discharging the loop filter. The four transistor 30-33 are formed in a complementary configuration such that when UPB is at logic high, UP is at logic low and when at the same time DN, the charge pump circuit can still flow current from VDD to VSS so that the charge pump does not shut off suddenly to create large spark noise to the loop filter 140. The transistors 31 and 33 are normally referred to as normal mode transistors (normal leg). The transistor 30 and 32 are referred to as idle mode transistor (idle leg) since as the transistors 30 and 32 are not used for charging and discharging the loop filter. In some cases, the transistors 10 and 20 can each be replaced by two transistors connected in cascaded configuration.

Figure 4:
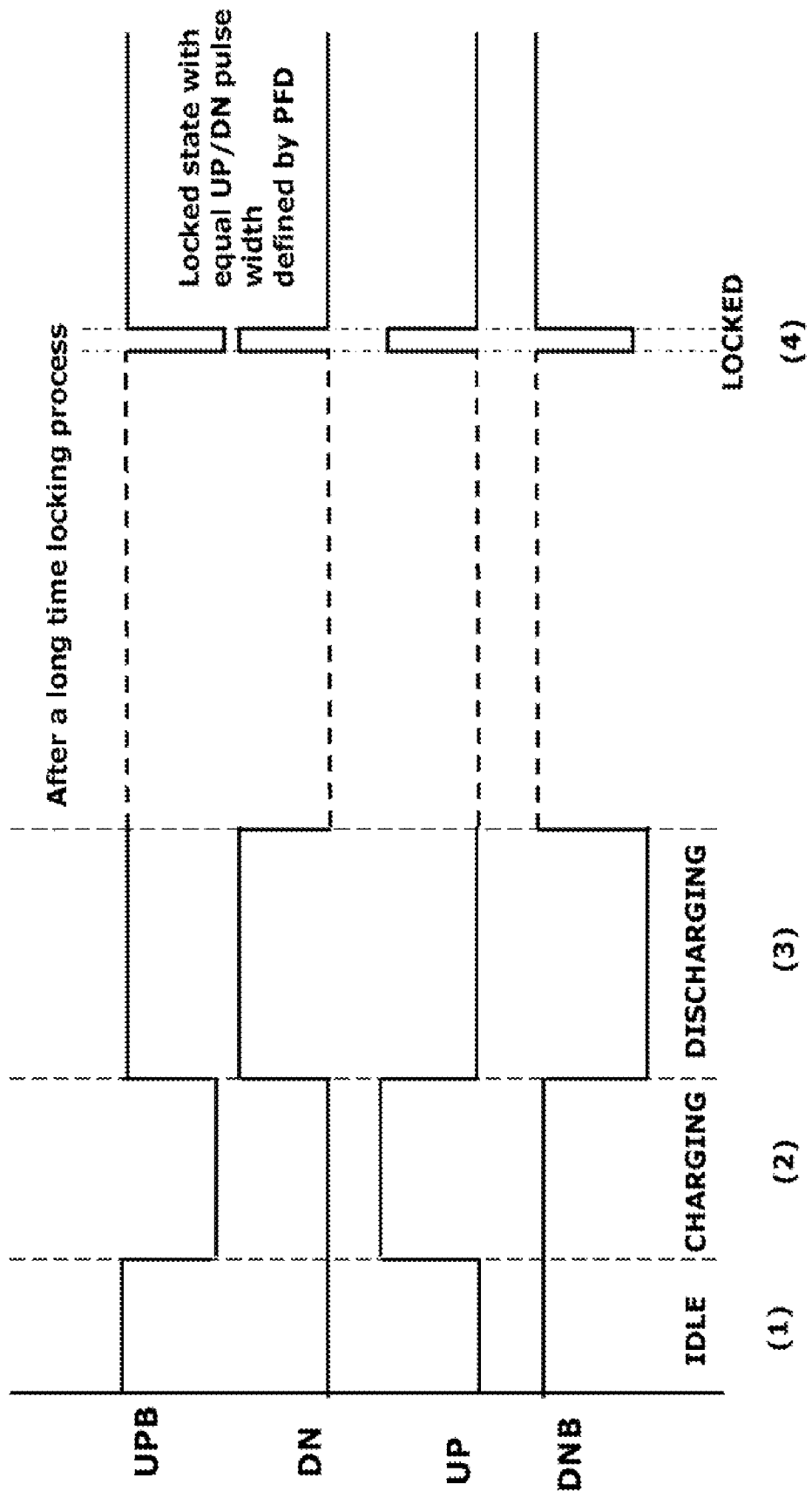
FIG. 4 illustrates waveform diagrams of the outputs of the phase frequency detector in FIG. 1.

Waveform diagrams of the four output signals UP, UPB, DN, and DNB from the PFD 120 are illustrated in FIG 4. The waveforms can be separated into four phases. In an IDLE phase, UP is at logic low and DNB is at logic high, passing the current from VDD to VSS through the idle leg. The idle loop is turned off in other phases.

In a CHARGING phase, UPB is at logic low. The sourcing current IUP flows from VDD to the loop filter. In the DISCHARGING phase, DN is at logic high. The sinking IDN current flows from the loop filter 140 to VSS. In the LOCKED phase, UPB is Low and DN is logic high. The smallest pulse width defined by the PFD 120 can reduce the dead zone problem, which is well known in PLL circuit designs.

Referring back to FIG. 1, the operation for the PLL circuit 100 is further explained below. Assuming VCOOUT frequency is 96 MHz, we set M=4, N=96, IUP=IDN=5 μA, VCO gain=150 MHz/V. The input clock signal XOSC_CLK=4 MHz. During a system start-up, LFOUT is at 0V. The output frequency of the VCO 150 is 288 MHz, which is the highest attainable VCO output frequency of the circuit. The frequency of the FBCLK signal equals 288 MH/96=3 MHz. The frequency of the REFCLK signal is 4 MHz/4=1 MHz. FBCLK has a higher frequency than REFCLK.

The PFD 120 outputs UPB and DN signals, with the UPB having wider pulse duration than DN. The CP 130 receives the UPB and DN signals and causes current to flow from IUP into the LF 140, thereby charging up LFOUT to above 0 V. The VCO 150 is selected to be a negative gain oscillator. A higher input voltage results in a lower VCO output frequency. Therefore, VCOOUT can be slowed down from 288 MHz to say 280 MHz in the initial stage. FBCLK at this moment is 280 MHz/96=2.91 MHz which get closer to the 1 MHz in the REFCLK. This process continues until the CP charges enough current to LF to a point that VCOOUT equals to 96 MHz, and after division, FBCLK equals to 1 MHz, which matches the REFCLK. In this instant, we said the PLL is under locked state and since the PLL is a closed loop system, therefore, the VCOOUT frequency can maintain as it is in the lock state. Reversely, if the VCO starts at the lowest frequency with LFOUT is at highest voltage VDD, say 10 MHz, the divided frequency FBCLK equals to 10 MHz/96=0.1042 MHz, which is much lower than REFCLK. Therefore, after PFD, DN pulse width can be much wider than UPB, discharging the LF output LFOUT from its highest voltage VDD to a lower voltage. This lower voltage can affect the VCO to output a higher frequency until at a point the REFCLK matches the FBCLK in terms of phase and frequency.

From above, we can see that the charging and discharging of the CP 130 is operated at fixed charging current IUP and discharging current IDN from the BG 160. The natural frequency $\omega_N$ for the PLL circuit 100 is fixed if other parameters are fixed as well.

Figure 5:
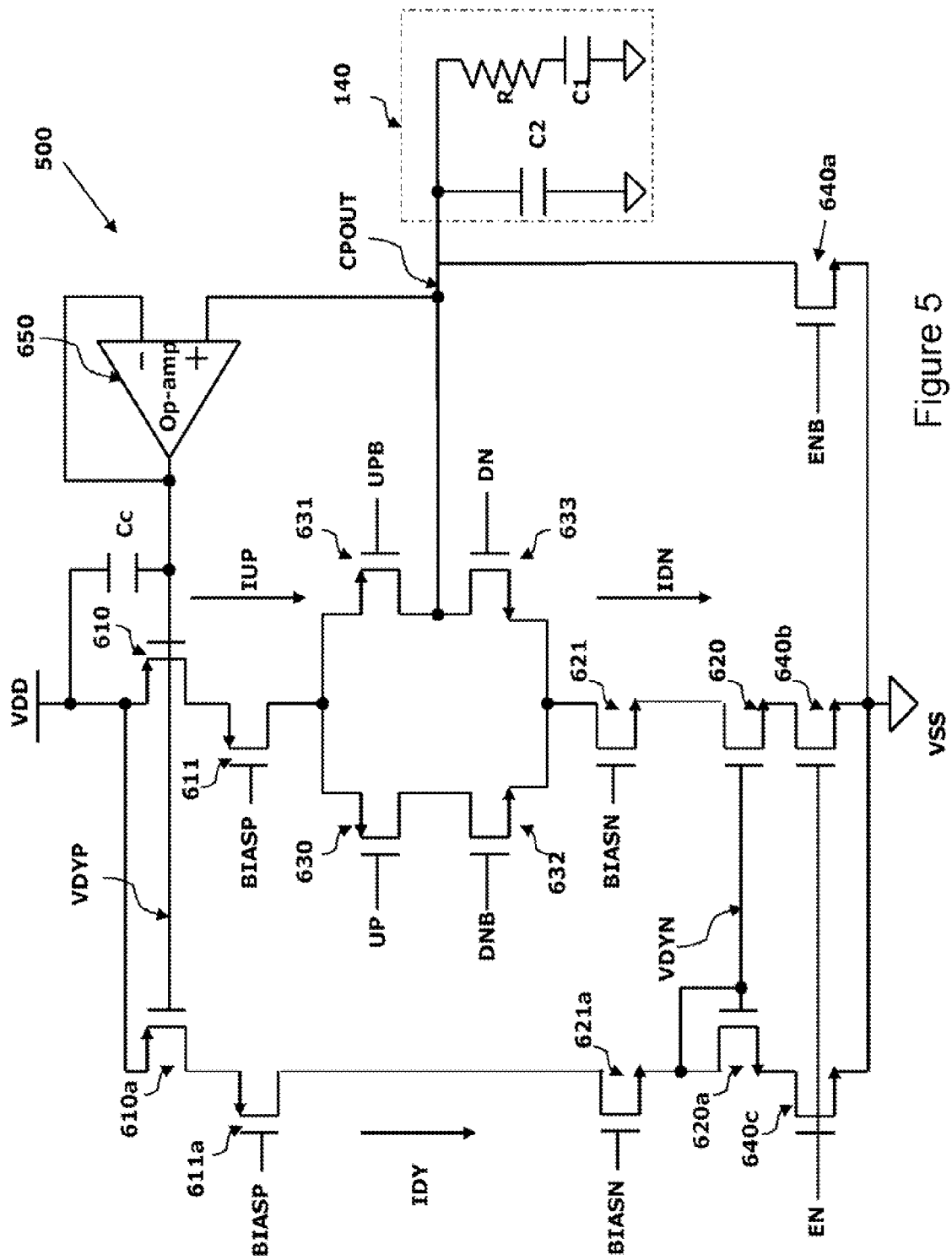
FIG. 5 is a schematic diagram of a charge pump circuit for a phase locked loop circuit in accordance with the present specification.

FIG. 5 shows a charge pump circuit 500 suitable for the charge pump 130 in accordance with the present specification. The charge pump circuit 500 includes PMOS transistors 610 and 611 and NMOS transistor 620 and 621 that are respectively connected cascoded configurations to increase the output impedance of the charge pump circuit 500.

The charge pump circuit 500 also includes an operational amplifier (op-amp) 650. The PMOS transistor 610 is biased with an output voltage VDYP of the op-amp 650. The op-amp 650 is connected in a unity gain buffer configuration with its negative input connected to the output. The positive input of the op-amp 650 is coupled to the output noed CPOUT of the charge pump circuit 500 that is further connected to the loop filter 140.

The charge pump circuit 500 also includes PMOS transistors 610a/611a and NMOS transistors 620a/621a, which are respectively the current mirrors of the PMOS transistors 610/611 and the NMOS transistors 620/621. The PMOS transistors 610/610a are biased with VDYP, the output of the op-amp 650. The NMOS transistor 620/620a are biased with VDYN, the drain voltage of the PMOS transistor 621a. Transistor pairs 610/610a, 611/611a, 621/621a, 620/620a respectively have subsatantially the same sizes. Cascoded transistor pairs 610/611a supplies a drain current IDY to bias transistor 621a/620a. As the gate voltage VDYN of transistor 620a is now coupled to transistor 610, therefore it forms the current mirror to couple the drain current IDY to transistor 620.

The gates of the transistor 611 and 611a are controlled by the voltage signal BIASP from the bias generator 160. The gates of the transistor 621 and 621a are controlled by the voltage signal BIASN from the bias generator 160. The BIASP and BIASN are provided to keep PMOS transistors 611/611a and NMOS transistors 621/621a in transistors' saturation regions.

The capacitor $C_C$ together with the output impedance of the op-amp 650 forms a low pass filter for the input voltage CPOUT, which can minimize switching noise to the node VDYP. Since the op-amp 650 is connected in a unity gain buffer configuration, additional compensation circuitry is required for its stability. In this regard, the capacitor $C_C$ can also function as compensation capacitor. Three NMOS transistors 640a-c are provided as enable, disable and start-up to make the charge pump circuit 500 self-contained with complete functions.

The transistors 631 and 633 form the core block for charging and discharging the loop filter 140. The transistor 630 and 632 form the core block for controlling an idle state. The transistors 630 and 632 are used to keep a current flowing through the current mirror during an idle state such that the current spike is minimized when the transistor 631 and 633 are turned on in a lock state. The use of the current in the current mirror to stabilize the current in the locked in state is referred to as current steering. The operations of the transistors 630-633 in the charge pump circuit 500 are substantially the same as the operations of the transistors 30-33 in the charge pump circuit 300. The waveforms for UPSB, DN, UP and DNB are substantially the same as those shown in FIG. 4.

Disabled Mode

In the disabled mode, EN is at logic low and ENB is at logic high. CPOUT is pulled low by transistor 640a. The output of the op-amp 650 can be biased at logic low because the input to the unity gain feedback of the op-amp 650 is at logic low. VDYP is therefore also at logic low. UPB can be set to logic high, UP to logic low, DN to logic low, and DNB to logic high during disabled mode. The transistors 640b-640c are included prevent leakage of DC current in disabled mode. The transistors 640b-640c can shut off the current in the circuit of the charge pump circuit 500 in disabled mode.

Normal Operation Mode

In a normal operation mode, EN is at logic high and ENB is at logic low. CPOUT can kick start from the logic low state from the disabled mode. The op-amp 650 initially biases the VDYP at logic low, keeping the $V_{SG}$ of PMOS transistors 610 and 610a at the maximum value and $V_{SD}$ of transistors 610 and 610a at the minimum value. The source node of transistors 611 and 611a is nearly at VDD and makes their $V_{SD}$ at the maximum value. The high $V_{SD}$ produces high drain current provided that the gate bias for PMOS transistors 610 and 610a are fixed at BIASP. Therefore, initially, the drain current flowing through the two branches 610a/611a and 610/611 are at maximum value and they are the same as well. The drain current flowing through the branch 610a/611a flows through transistor 620a and forms a gate bias VDYN. The VDYN then bias the NMOS transistors 620/620a to form the current mirror. Therefore the drain current of transistor 620 always copies the current IDY, thus resulting in current matching between IUP and IDN.

The VCO 150 can be selected to be a negative gain oscillator. The VCO 150 initially oscillates at its highest output frequency due to a logic low at CPOUT, the UPB pulse width can be much wider than DN in order to charge up the loop filter 140 to slow down the VCO frequency.

In the charging region, referring to FIG. 4, the transistor 631 is turned on as UPB is logic low. The charging current IUP flows into the loop filter 140, to charge up CPOUt voltage at the loop filter 140 from zero voltage to a higher voltage. The higher the CPOUT voltage, the lower the VCO output frequency. AS the CPOUT voltage gradually increases, the CPOUT voltage can be coupled to VDYP by the low-pass filter consisting of $C_C$ and the op-amp 650, which dynamically changes the biases to the PMOS transistors 610 and 610a. The $V_{SG}$ of the PMOS transistor 610 thus dynamically changes or decreases according to the CPOUT. The dynamic increase or decrease of $V_{SG}$ of the transistor 610 can dynamically increase or decrease its drain voltage, which can in turn change the $V_{SD}$ of PMOS transistor 611, and finally its drain current, that is, the charging current IUP. As a result, CPOUT voltage or the loop filter voltage can gradually increase. The frequency of the signal VCOOUT can gradually decrease until REFCLK matches with FBCLK, at which time the PLL is said to be locked.

In the discharging region, in contrast, DN is at logic high, as shown in FIG. 4. The NMOS transistor 633 is turned on and the drain current IDY is copied to IDN current, as described above, to complete the discharging process. In this manner, the charging current IUP is totally matched with the discharging current IDN with the current mirror operation of transistors pair 610/611, 610a/611a, 621a/620a, and 621/620.

The above descriptions show that the charge pump current can dynamically be decreased from a maximum current to a pre-set current value until the PLL circuit locks. The pre-set current value can be adjusted in the PLL circuit designs. For example, the maximum current for a charge pump circuit can be designed to be 30 μA. The pre-set current value can be set at 5 μA. It means that the initial kick star current is equal to 30 μA and the final current after locked is equal to 5 μA. In this manner, the charge pump currents during the kick start and the locked-in phase can be optimized. The lock-in time for the PLL can be dramatically reduced without increasing the phase jitter noise bandwidth after the frequency is locked. The charge pump current is only at a much higher value during the initial state to reduce the lock-in time. The charge pump current is kept at a minimum after the frequency is locked to minimize jitter noise.

Figure 6:
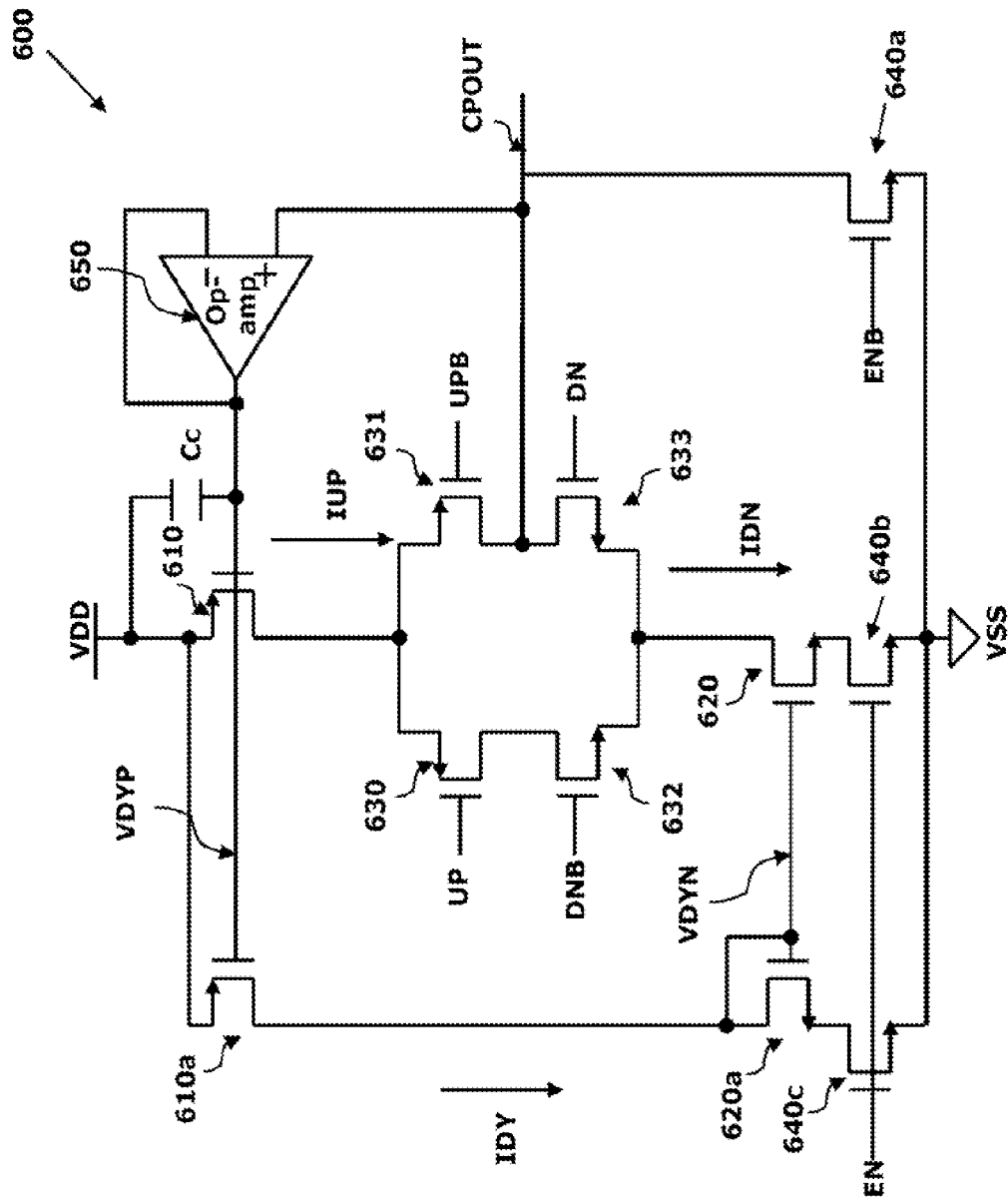
FIG. 6 is a schematic diagram of another implementation charge pump circuit for a phase locked loop circuit in accordance with the present specification.

FIG. 6 illustrates a charge pump circuit 600, another implementation that is suitable for the charge pump circuit 130 under low voltage operation. The cascoded PMOS transistors 611 and 610a and the cascoded NMOS transistor 621/621a in the charge pump circuit 500 are respectively removed to leave single PMOS transistors pair 610/610a and a single NMOS transistor pair 620/620a. Moreover, the charge pump circuit 600 is self-biased and do not receive inputs (BIASP and BIASN) from a bias generator. The implementation shown in FIG. 6 is suitable for low voltage supply operations, wherein voltage between VDD and VSS needs not to be reduced by cascoded transistors.

Figure 7:
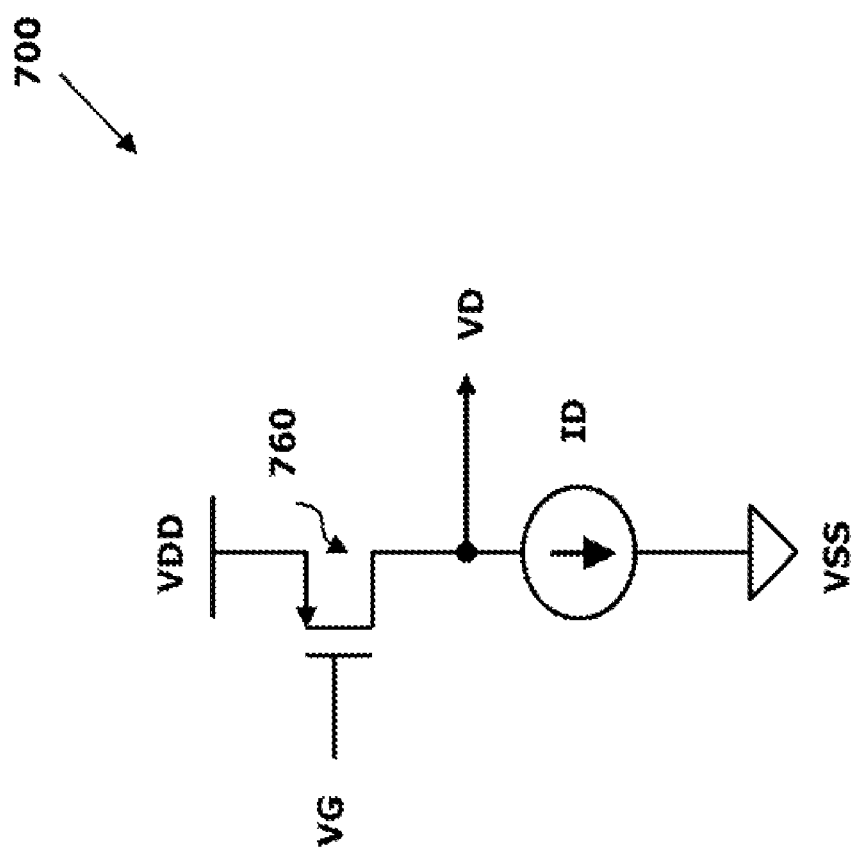
FIG. 7 is a schematic diagram for a current biasing model for a PMOS transistor (610 in FIGS. 5 and 6) that controls biasing current in the charge pump circuit.
Figure 8:
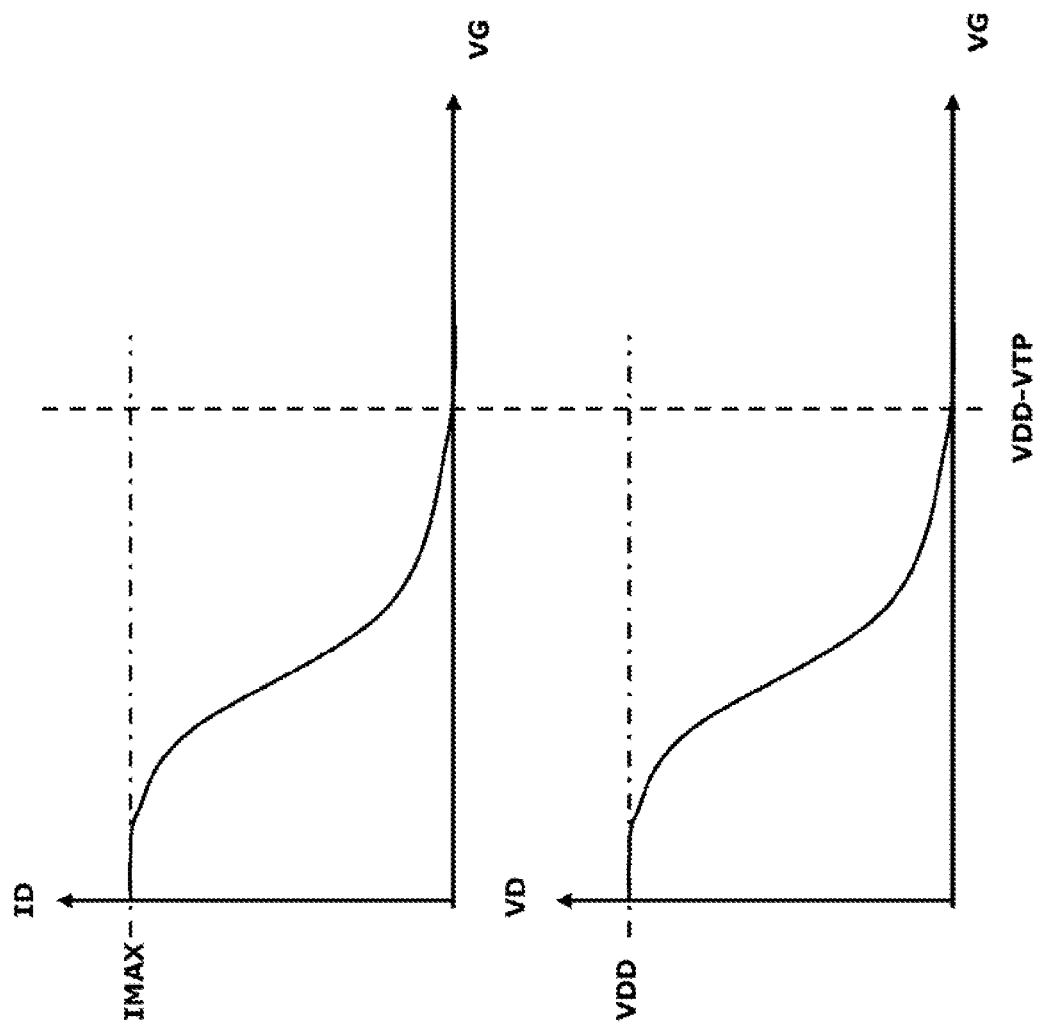
FIG. 8 illustrates typical variations of the drain current and drain voltage as functions of a gate voltage transistor shown in FIG. 7.

FIG. 7 is a current biasing model for a PMOS transistor 760. The drain current of the PMOS transistor 760 is ID; the drain voltage is VD. The gate voltage is VG. FIG. 8 illustrates typical variations of ID and VD as functions of VG predicted by modeling the PMOS transistor 760. As VG increases from 0 V to VDD, ID decreases from $I_{MAX}$, and reaches zero when source-to-gate bias $V_{SG}$ is less than VDD-$V_{TP}$ (threshold turn-on voltage) and the transistor 610 is turned off. VD also decreases from VDD to VSS (set at 0 V). The dependence of ID on VG can be calculated using standard transistor equations. $I_{MAX}$ can depend on device size. $V_{SG}$ and $V_{SD}$ can depend on fabrication process parameters.

Figure 9:
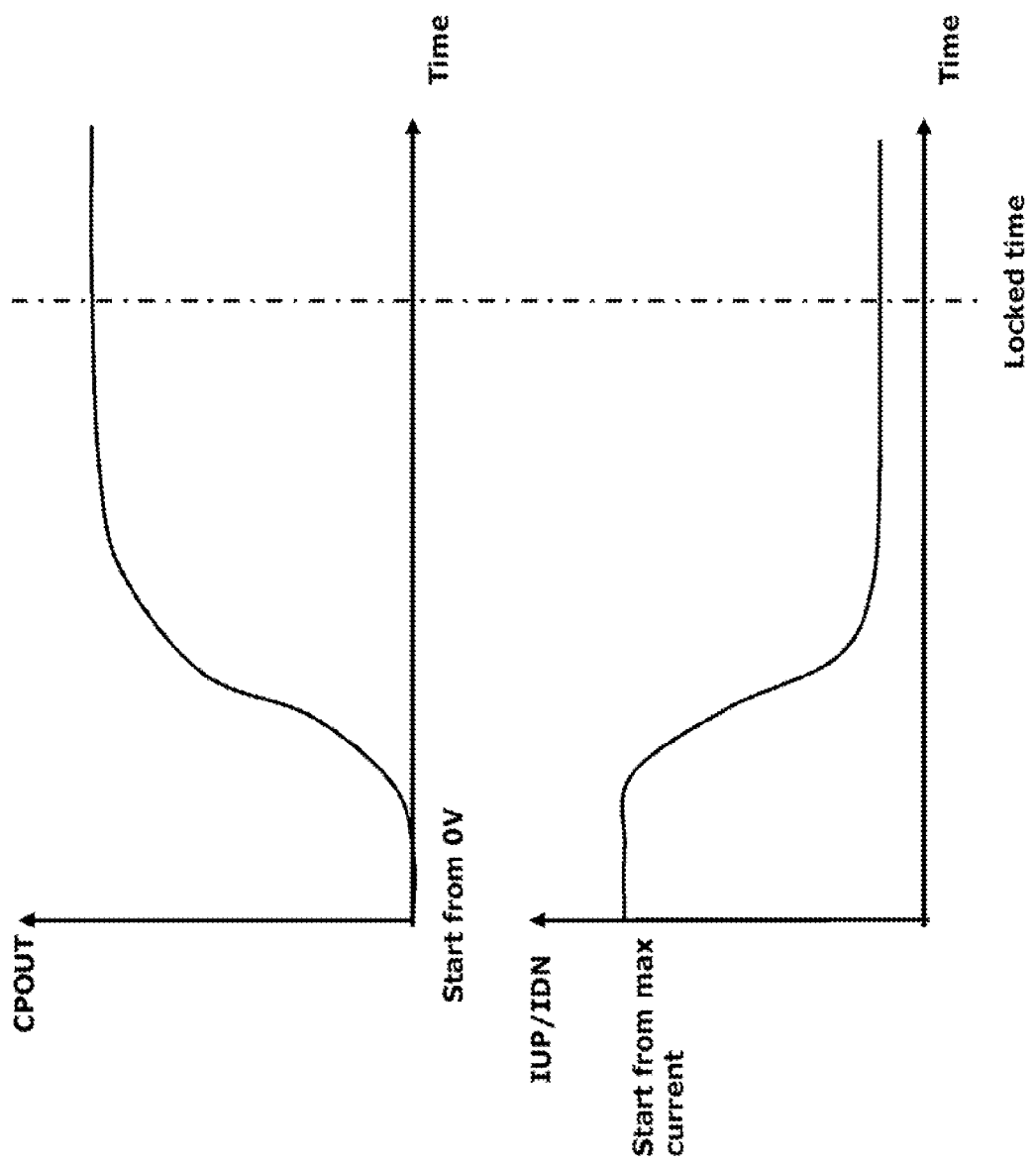
FIG. 9 are waveform diagrams of dynamic current and voltage change for the charge pump shown in FIGS. 5 and 6.

FIG. 9 illustrates typical waveforms for CPOUT and IUP/IDN in the charge pump circuits 500 and 600 shown in FIGS. 5 and 6. CPOUT gradually rises from 0V to a stable voltage. The time for CPOUT to reach the stable voltage is the PLL is locked-in time. IUP and IDN are initially at their respective maximum currents and gradually decrease to fixed low current outputs. As a result, IUP and IDN dynamically change from a high current state for minimizing lock-in time, to a low current state for minimizing noise.

The disclosed circuit can include one or more of the following advantages. The disclosed charge pump circuit can dynamically provide charge-pump gain or charge pump current depending on the operation mode of the circuit. This dynamic capability allows the disclosed charge pump circuit to be able to simultaneously optimize several properties of the host circuit that is provides the charge current to. The dynamic capability also allows the disclosed charge pump circuit to be flexibly applied to a wide range of circuit applications.

The disclosed phase locked loop circuit can provide faster frequency hopping and low data transmission noises. The disclosed phase locked loop circuit can have shorter lock-in times than conventional PLL circuits, which reduces loss in data transmission rate. At the same, the disclosed phase locked loop circuit can also minimize jitter noise in data transmissions. The decreased lock-in time and minimized jitter noise are achieved by dynamically adjusting charge pump current, which determines the natural frequency $\omega_N$ in the disclosed PLL circuit. $\omega_N$ and the charge pump current are increased to reduce the lock-in time during frequency hopping. After the electronic system is locked into a new frequency, $\omega_N$ and the charge pump current are decreased to minimize the jitter noise bandwidth. The increased hopping rate and decreased noise make the disclosed phase locked loop circuit suitable for a wide range of electronic applications.

Another advantage of the disclosed charge pump circuit is that the charge and discharge current are kept substantially constant through the locking process and after the lock-in. The current output of the charge pump can thus be kept stable and current spikes are prevented when the charge pump switches from non-locking mode to locking a mode.

It is understood that the disclosed phase lock loop circuit is compatible with other designs and components than the examples described above. The disclosed charge pump circuits can be compatible with circuits other than phase lock loop circuit. Various logic functions in the disclosed charge pump circuits can be achieved by different components without deviating from the spirit of the instant specification.

What is claimed is:

1. A charge pump circuit, comprising:
a first PMOS transistor;
a first NMOS transistor connected with the first PMOS transistor at a CPOUT node that is configured to provide an output signal from the charge pump circuit;
a second PMOS transistor connected between a high-voltage supply terminal (VDD) and the first PMOS transistor, the second PMOS transistor being configured to provide a current IUP to the first PMOS transistor;
a second NMOS transistor connected between a low-voltage supply terminal (VSS) and the first NMOS transistor, the second NMOS transistor being configured to receive a current IDN from the first NMOS transistor;
a capacitor connected to VDD and a gate of the second PMOS transistor;
an operational amplifier (OP-AMP) having its negative input and its output connected to the gate of the second PMOS transistor, and its positive input connected to the CPOUT node;
a third NMOS transistor connected to the node CPOUT and VSS, the third NMOS transistor configured to be controlled by an external signal ENB; and
a fourth NMOS transistor connected between the first NMOS transistor and VSS, the fourth NMOS transistor configured to be controlled by an external signal EN, wherein EN and ENB are complementary signals.

2. The charge pump circuit of claim 1, further comprising:
a third PMOS transistor configured as a current mirror transistor for the second PMOS transistor; and
a fifth NMOS transistor configured as a current mirror transistor for the second NMOS transistor, wherein the third PMOS transistor and the fifth NMOS transistor are connected between VDD and VSS.

3. The charge pump circuit of claim 2, wherein the third PMOS transistor and the fifth NMOS transistor are configured to allow a mirror current IDY flowing between VDD and VSS, wherein the mirror current IDY is substantially the same as the current IUP or the current IDN.

4. The charge pump circuit of claim 3, further comprising:
a fourth PMOS transistor; and
a sixth NMOS transistor connected to the fourth PMOS transistor, wherein the fourth PMOS transistor and the sixth NMOS transistor are configured to control the mirror current IDY in response to a bias voltage signal (BIASP) received at a gate of the fourth PMOS transistor and a bias voltage signal (BIASN) received at a gate of the sixth NMOS transistor.

5. The charge pump circuit of claim 1, further comprising:
a third PMOS transistor connected between the second PMOS transistor and the first PMOS transistor, wherein the second PMOS transistor and the third PMOS transistor are connected in a cascoded configuration to provide the current IUP to the first PMOS transistor, and wherein the third PMOS transistor is configured to be controlled by a bias voltage signal (BIASP).

6. The charge pump circuit of claim 1, further comprising:
a fifth NMOS transistor connected between the second NMOS transistor and the first NMOS transistor, wherein the second NMOS transistor and the fifth NMOS transistor are connected in a cascoded configuration to receive the current IDN from the first NMOS transistor, and wherein the fifth NMOS transistor is configured to be controlled by a bias voltage signal (BIASN).

7. The charge pump circuit of claim 1, further comprising:
a third PMOS transistor; and
a fifth NMOS transistor connected with the fifth PMOS transistor, wherein the third PMOS transistor and the fifth NMOS transistor are configured to receive the current IUP and send a current IDN substantially equal to the current IUP to the second NMOS transistor when at lease one of the first PMOS transistor or the first NMOS transistor is turned off.

8. The charge pump circuit of claim 7, wherein the first PMOS transistor and the third PMOS transistor are respectively controlled by an input signal UPB and an input signal UP, wherein UP and UPB are complementary signals.

9. The charge pump circuit of claim 7, wherein the first NMOS transistor and the fifth NMOS transistor are respectively controlled by an input signal DN and an input signal DNB, wherein DN and DNB are complementary signals.

10. A charge pump circuit, comprising:
a first PMOS transistor controlled by an input signal UPB;
a first NMOS transistor connected with the first PMOS transistor at a CPOUT node that is configured to provide an output signal from the charge pump circuit, wherein the first NMOS transistor is controlled by an input signal DN;
a second PMOS transistor connected between a high-voltage supply terminal (VDD) and the first PMOS transistor, the second PMOS transistor being configured to provide a current IUP to the first PMOS transistor;
a second NMOS transistor connected between a low-voltage supply terminal (VSS) and the first NMOS transistor, the second NMOS transistor being configured to receive a current IDN from the first NMOS transistor;
a capacitor connected to VDD and a gate of the second PMOS transistor;
an operational amplifier (OP-AMP) having its negative input and its output connected to the gate of the second PMOS transistor, and its positive input connected to the CPOUT node;
a third PMOS transistor configured as a current mirror transistor for the second PMOS transistor;
a third NMOS transistor configured as a current mirror transistor for the second NMOS transistor, wherein the third PMOS transistor and the third NMOS transistor are connected between VDD and VSS;
a fourth PMOS transistor; and
a fourth NMOS transistor connected to the fourth PMOS transistor, wherein the fourth PMOS transistorand the fourth NMOS transistorare configured to control the mirror current IDY in response to bias voltage signal (BIASP) received at a gate of the fourth PMOS transistor and a bias voltage signal (BIASN) received at a gate of the fourth NMOS transistor.

11. The charge pump circuit of claim 10, wherein the third PMOS transistor and the third NMOS transistor are configured to allow a mirror current IDY flowing between VDD and VSS, wherein the mirror current IDY is substantially the same as the current IUP or the current IDN.

12. The charge pump circuit of claim 10, further comprising:
a fifth PMOS transistor connected between the second PMOS transistor and the first PMOS transistor, wherein the second PMOS transistor and the fifth PMOS transistor are connected in a cascoded configuration to provide the current IUP to the first PMOS transistor, and wherein the fifth PMOS transistor is configured to be controlled by a bias voltage signal (BIASP).

13. The charge pump circuit of claim 10, further comprising:
a fifth NMOS transistor connected between the second NMOS transistor and the first NMOS transistor, wherein the second NMOS transistor and the fifth NMOS transistor are connected in a cascoded configuration to receive the current IDN from the first NMOS transistor, and wherein the fifth NMOS transistor is configured to be controlled by a bias voltage signal (BIASN).

14. The charge pump circuit of claim 10, further comprising:
a fifth PMOS transistor; and
a fifth NMOS transistor connected with the third PMOS transistor, wherein the fifth PMOS transistor and the fifth NMOS transistor are cinfigured to receive the current IUP and send a current IDN substantially equal to the current IUP to the second NMOS transistor when at least one of the first PMOS transistor or the first NMOS transistor is turned off.

15. The charge pump circuit of claim 14, wherein the fifth PMOS transistor is controlled by an input signal UP and the fifth NMOS transistor is controlled by an input signal DNB, wherein UP and UPB are complementary signals, wherein DN and DNB are complementary signals.

16. The charge pump circuit of claim 10, further comprising:
a fifth NMOS transistor connected to the node CPOUT and VSS, the fifth NMOS transistor configured to be controlled by an external signal ENB; and
a sixth NMOS transistor connected between the first NMOS transistor and VSS, the sixth NMOS transistor configured to be controlled by an external signal EN, wherein EN and ENB are complementary signals.

17. A charge pump circuit, comprising:
a first PMOS transistor controlled by an input signal UPB;
a first NMOS transistor connected with the first PMOS transistor at a CPOUT node that is configured to provide an output signal from the charge pump circuit, wherein the first NMOS transistor is controlled by an input signal DN;
a second PMOS transistor connected between a high-voltage supply terminal (VDD) and the first PMOS transistor, the second PMOS transistor being configured to provide a current IUP to the first PMOS transistor;
a second NMOS transistor connected between a low-voltage supply terminal (VSS) and the first NMOS transistor, the second NMOS transistor being configured to receive a current IDN from the first NMOS transistor;
a capacitor connected to VDD and a gate of the second PMOS transistor;
an operational amplifier (OP-AMP) having its negative input and its output connected to the gate of the second PMOS transistor, and its positive input connected to the CPOUT node;
a third PMOS transistor configured as a current mirror transistor for the second PMOS transistor;
a third NMOS transistor configured as a current mirror transistor for the second NMOS transistor, wherein the third PMOS transistor and the third NMOS transistor are connected between VDD and VSS;
a fourth PMOS transistor connected between the second PMOS transistor and the first PMOS transistor, wherein the second PMOS transistor and the fourth PMOS transistor are connected in a cascoded configuration to provide the current IUP to the first PMOS transistor, and wherein the fourth PMOS transistor is configured to be controlled by a bias voltage signal (BIASP); and a fifth PMOS transistor configured to control the mirror current IDY in response to BIASP received at a gate of the fourth PMOS transistor.

18. The charge pump circuit 17, further comprising:
a fourth NMOS transistor connected to the fourth PMOS transistor, wherein the fourth NMOS transistor is configured to control the mirror current IDY in response to a bias voltage signal (BIASN) received at a gate of the fourth NMOS transistor; and a fifth NMOS transistor connected between the second NMOS transistor and the first NMOS transistor, wherein the second NMOS transistor and the fifth NMOS transistor are connected in a cascoded configuration to receive the current IDN from the first NMOS transistor, and wherein the fifth NMOS transistor is configured to be controlled by BIASN.

* * * * *